United States Patent [19]
Hashimoto et al.

[11] Patent Number: 6,060,368
[45] Date of Patent: May 9, 2000

[54] MASK PATTERN CORRECTION METHOD

[75] Inventors: Koji Hashimoto; Hisako Aoyama; Soichi Inoue, all of Yokohama; Kazuko Yamamoto, Tokyo; Sachiko Kobayashi, Ichikawa, all of Japan

[73] Assignee: Kabushiki Kaisha Toshiba, Kawasaki, Japan

[21] Appl. No.: 09/206,364

[22] Filed: Dec. 7, 1998

[30] Foreign Application Priority Data

Dec. 9, 1997 [JP] Japan ..................................... 9-338762

[51] Int. Cl.$^7$ .................................................. H01L 21/76
[52] U.S. Cl. .......................... 438/401; 438/462; 438/800
[58] Field of Search ..................................... 438/401, 462, 438/800, 5, 7; 257/797, 798; 430/30, 296, 942

[56] References Cited

U.S. PATENT DOCUMENTS 5,879,844  3/1999  Yamamoto et al. ........................ 430/30
5,995,199  11/1999  Shinozaki et al. ......................... 355/52

OTHER PUBLICATIONS

L. Liebmann, et al., SPIE vol. 2322, Photomask Technology and Management (1994), pp. 229–238.

*Primary Examiner*—Charles Bowers
*Assistant Examiner*—Craig Thompson
*Attorney, Agent, or Firm*—Finnegan, Henderson, Farabow, Garrett & Dunner, L.L.P.

[57] ABSTRACT

This invention is provided to eliminate the optical proximity effect which will occur because of different rates of dimensional change between before and after etching when a plurality of gate materials are etched in a single device. After a to-be-corrected region is extracted, an $n^+$-type polysilicon gate layer is extracted. Then, the distance is calculated from the $n^+$-type polysilicon gate layer to a pattern adjacent thereto which can be a $p^+$-type polysilicon gate layer, thereby correcting the size of the $n^+$-type polysilicon gate layer with reference to a correction table for the pattern adjacent to the $n^+$-type polysilicon gate layer. After that, a $p^+$-type polysilicon gate layer is extracted. Then, the distance is calculated from the $p^+$-type polysilicon gate layer to a pattern adjacent thereto which can be an $n^+$-type polysilicon gate layer, thereby correcting the size of the $p^+$-type polysilicon gate layer with reference to a correction table for the pattern adjacent to the $p^+$-type polysilicon gate layer.

16 Claims, 6 Drawing Sheets

| WIDTH OF SPACE BETWEEN ADJACENT PATTERNS | CORRECTION AMOUNT |
|---|---|
| 0~S$_1$ | 0 |
| S$_1$~S$_2$ | -W$_1$ |
| S$_2$~S$_3$ | -W$_2$ |
| S$_3$~ | -W$_3$ |
| ⋮ | ⋮ |

| DISTANCE TO ADJACENT PATTERN | | CORRECTION AMOUNT (per edge) |
|---|---|---|
| n+POLYSILICON Si | p+POLYSILICON Si | |
| | 0~Sp1 | 0 |
| 0~Sn1 | Sp1~Sp2 | $-W_1/2$ |
| Sn1~Sn2 | -Sp2~ | $-W_2/2$ |
| Sn2~Sn3 | | $-W_3/2$ |
| Sn3~ | | $-W_4/2$ |

MASK PATTERN CORRECTION METHOD

BACKGROUND OF THE INVENTION

This invention relates to a exposure mask pattern correction method and system for use in a lithography step included in a semiconductor manufacturing process.

In accordance with the development of semiconductor devices, demands for high integration are becoming stronger year by year. A buried channel MOS transistor as shown in FIG. 1 is generally known as an example of a high-speed transistor.

Figure 1:
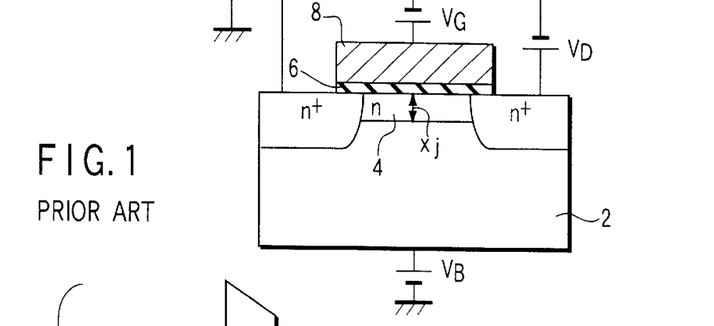
FIG. 1 is a view, showing a conventional buried channel MOS transistor.

In the buried channel MOS transistor, a shallow n-channel layer 4, which has a conductivity type opposite to a semiconductor substrate 2, is formed in a surface portion of the substrate by, for example, ion implantation as shown in FIG. 1. Simply forming the n-channel layer, however, results in a depletion type MOS transistor. To avoid this, channel cutting is generally performed using, for example, a work function difference, thereby forming an enhancement type buried channel MOS transistor.

To make an enhancement type transistor, a method for changing the gate material in accordance with the kind of the transistor is often employed. For example, in the case of an n-channel element, a p$^+$-type polysilicon gate electrode 8 is provided on the element with a gate insulating film 6 interposed therebetween, while in the case of a p-channel element, an n$^+$-type polysilicon gate electrode is provided in a similar manner.

Figure 2:
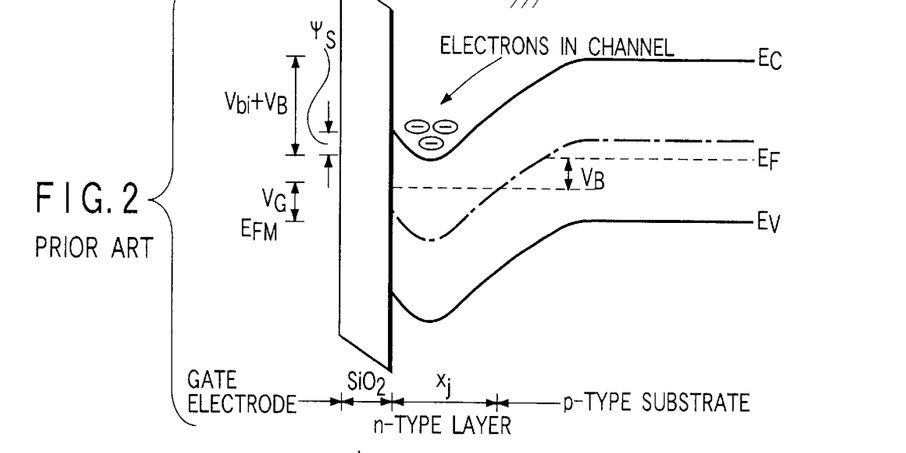
FIG. 2 is a view, showing energy bands of the buried channel transistor.

In the above-described MOS transistor, the channel for conducting a current is formed in a surface portion of the semiconductor as shown in FIG. 2. Accordingly, electrons in the channel will not be influenced by the crystal truncation rod scattering which may occur on the surface of the semiconductor, and can move at a movement speed close to that in the case of a bulk of electrons. Further, since a depletion layer is formed at a surface of the n-type layer on the drain side, the capacity between the gate and the drain is small, which means that the speed and current driving capacity of the element can be enhanced.

Moreover, since no pn-junction exists between the channel region and each of the source/drain regions, avalanche breakdown will not easily occur, and characteristic variations due to hot carrier implantation, which may be considered a serious problem in short-channel MOS devices, can be minimized.

As described above, where a buried channel transistor with various advantages is applied to both the n-channel and p-channel transistors formed in a single device, a p$^+$-type polysilicon gate electrode and an n$^+$-type polysilicon gate electrode are generally used for an n-channel element and a p-channel element, respectively.

Figure 3A:
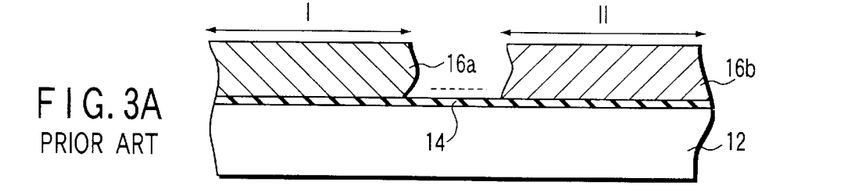
FIGS. 3A–3C are views, illustrating a gate forming process employed for a semiconductor device which uses a plurality of gate materials.

Referring then to FIGS. 3A–3C, a case where two gate materials are simultaneously etched after lithography will be examined. As is shown in FIG. 3A, a gate oxide film 14 is formed on a substrate 12, and then a p$^+$-type polysilicon layer 16a and an n$^+$-type polysilicon layer 16b are formed on the film 14 in an n-channel region I and a p-channel region II, respectively.

Figure 3B:
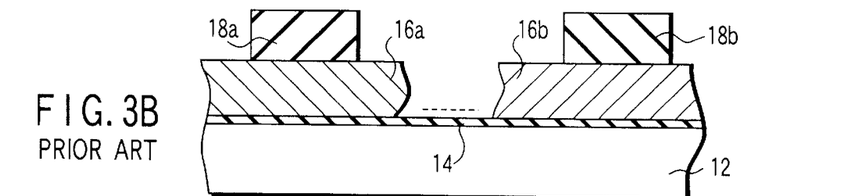
Figure 3C:
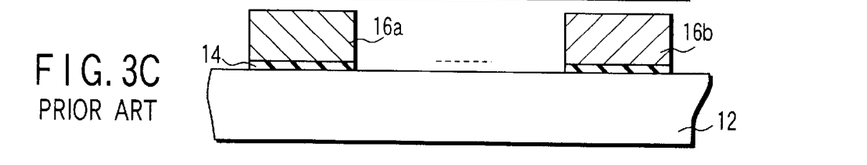

After the underlayers are formed for gates as above, resist patterns 18a and 18b are formed on the p$^+$-type polysilicon layer 16a and the n$^+$-type polysilicon layer 16b, respectively, as shown in FIG. 3B. After that, gate etching and resist separating steps are executed, thereby obtaining gate materials as shown in FIG. 3C.

Although the two gate materials are both polysilicon, they contain different impurities of different concentrations.

Accordingly, the gate materials may have different post-etching properties (i.e. they have different post-etching shapes, and different rates of dimensional change between before and after etching).

FIGS. 4A–4E are views, showing cases where different etching steps are performed so as to impart the same post-etching properties to both the gate materials.

Figures 4A, 4B:
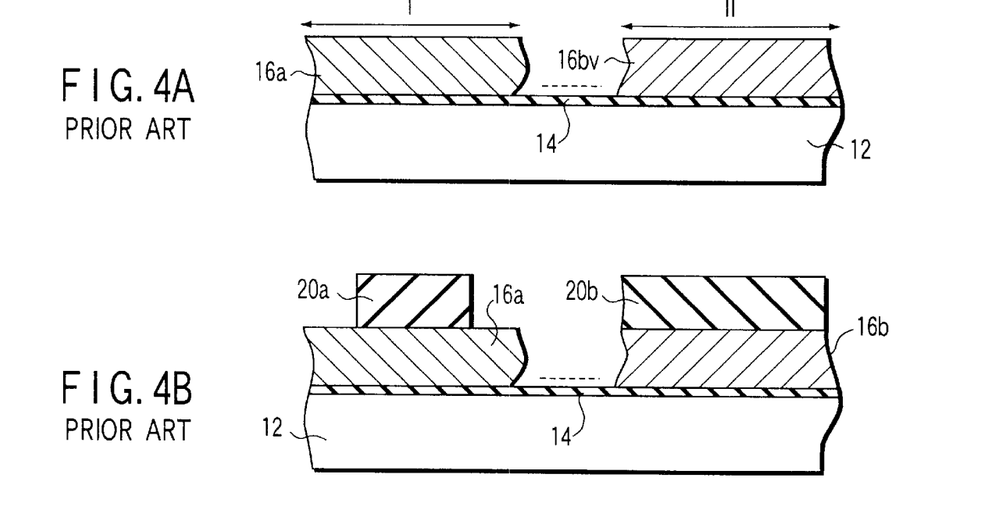
FIGS. 4A–4E are views, illustrating a gate forming process employed for a semiconductor device which uses a plurality of gate materials.

First, a gate underlayer is formed in each of channel regions I and II as shown in FIG. 4A, and then resist layers 20a and 20b are provided on p$^+$-type and n$^+$-type polysilicon layers 16a and 16b, respectively, thereby forming an n-channel transistor gate pattern, as is shown in FIG. 4B.

Figure 4C:
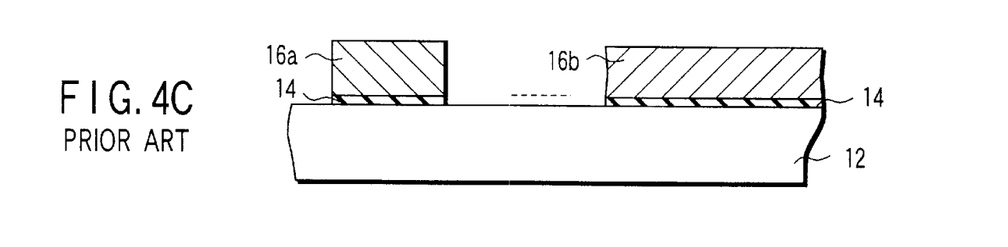
Figure 4D:
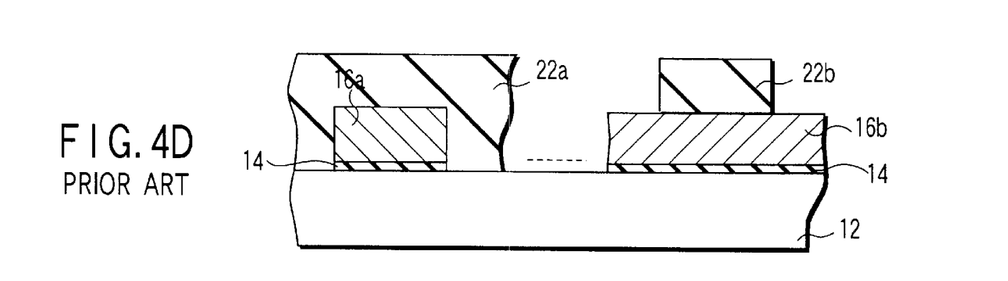
Figure 4E:
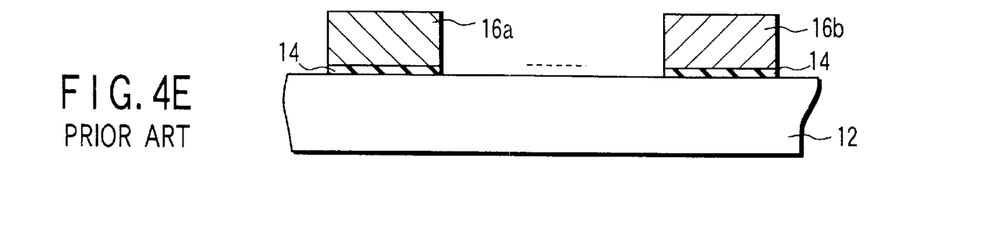

Subsequently, gate etching and resist separation of the n-channel transistor are performed as shown in FIG. 4C, and then the resultant structure is coated with resist layers 22a and 22b, thereby forming a p-channel transistor gate pattern, as is shown in FIG. 4D. After that, gate etching of the p-channel transistor and then resist separation are performed, thereby forming two gate materials as shown in FIG. 4E.

Even if etching is performed individually in each of two channels as above, it is difficult to make the aforementioned post-etching properties completely identical. Moreover, in light of reduction of the number of processes, the FIGS. 3A–3C process is used more often than the FIGS. 4A–4E process.

In addition, the problem of an OPE (Optical Proximity Effect) is getting a great deal of attention in accordance with the development of semiconductor device refining techniques. The OPE will be described below.

In the manufacture of semiconductor devices, process conditions are adjusted so as to make the dimension of a portion of a minimum process margin in a designed circuit identical to a desired (designed) value. In general, that portion indicates a portion of a minimum design dimension. In the case of a semiconductor memory element, for example, a memory cell section of a highest pattern density corresponds to it.

If the process conditions are adjusted to the memory cell section as a high integration pattern, a peripheral circuit section as a comparatively low integration pattern cannot always have designed dimensions because of the effect of the process. This effect is called the optical proximity effect (OPE), which results from complicated combination of the influences of an optical image obtained after light transmission through an exposure mask, a latent image in a resist, the resist coating/developing process, the conditions of the underlayers, the manner of etching of the underlayers, a post process such as cleaning, oxidation, etc., an exposure mask process, etc.

The optical proximity effect does not always result from an optical factor. To solve the OPE problem, OPC (Optical Proximity Correction) research on correcting designed dimensions when forming masks is being carried out in lots of institutes these days. From, for example, academic society theses, most present OPC techniques relate to correction using optical image simulation.

However, as aforementioned, the OPE is caused by a mask/wafer forming process, as well as an optical factor. Therefore, to realize highly accurate correction, it is necessary to inspect the OPE on a wafer obtained through the actual total process, and to perform dimension correction when forming a mask.

Figure 5A:
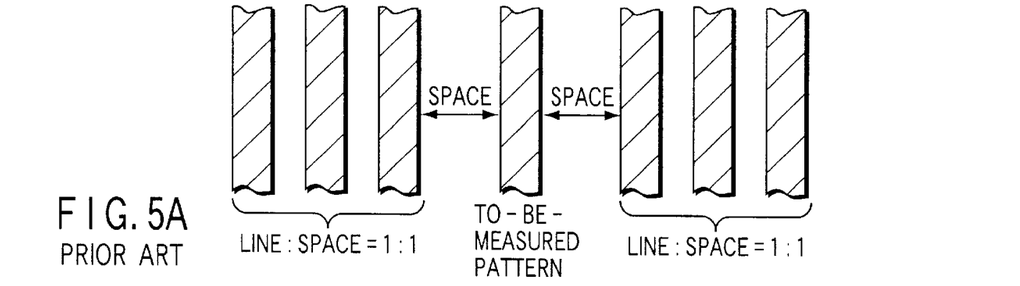
FIG. 5A is a view, showing the relationship of the distance between adjacent patterns to a finished dimension bias.
Figure 5B:
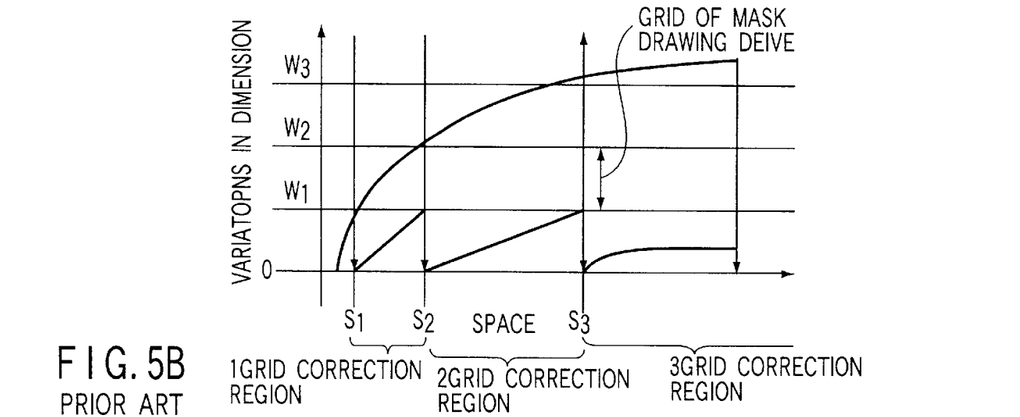
FIG. 5B is a view, showing the relationship of the distance between adjacent patterns to a dimension variation in the conventional correction method.

The Bucket method (L. Liebman et al. SPIE Vol. 2322 Photomask Technology and Management (1994) 299), for example, is known as a one-dimensional gate pattern correction method which considers the total process. In this method, the relationship (dependency upon pattern density) of a finished dimension bias (the difference between the actual finished dimension and a desired one) as shown, for example, in FIG. 5A, to a distance between a target pattern and a pattern adjacent thereto is obtained using a TEG (Test Element Group) for finished dimension measurement called "an ACLV (across the chip linewidth variation)" and formed of a wafer manufactured through the total process. Thereafter, the designed circuit is corrected by a finished dimension bias resulting from the dependency of a pattern dimension variation upon the pattern density, which is obtained by electrical measurements as shown in FIG. 5B. A correction table as shown in FIG. 7 is created on the basis of data shown in FIG. 5B, and used to correct an actual circuit pattern.

Figure 6:
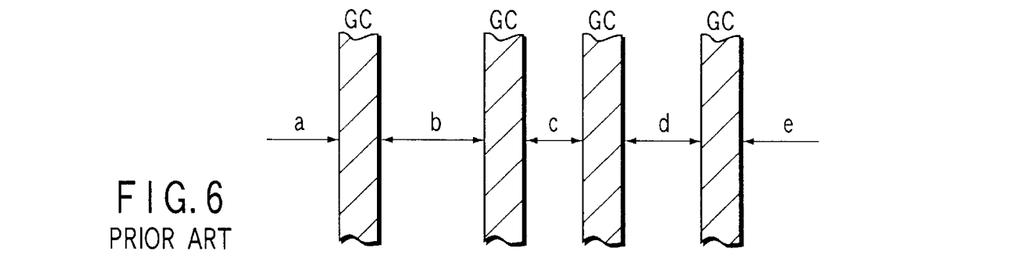
FIG. 6 is a view, showing examples of correction regions.

Specifically, after a to-be-corrected region is extracted, the width of a space between each pair of all adjacent patterns is calculated. If, for example, adjacent patterns GC are arranged as shown in FIG. 6, spaces of widths a, b, c, d and e are defined between the patterns GC.

Figure 7:
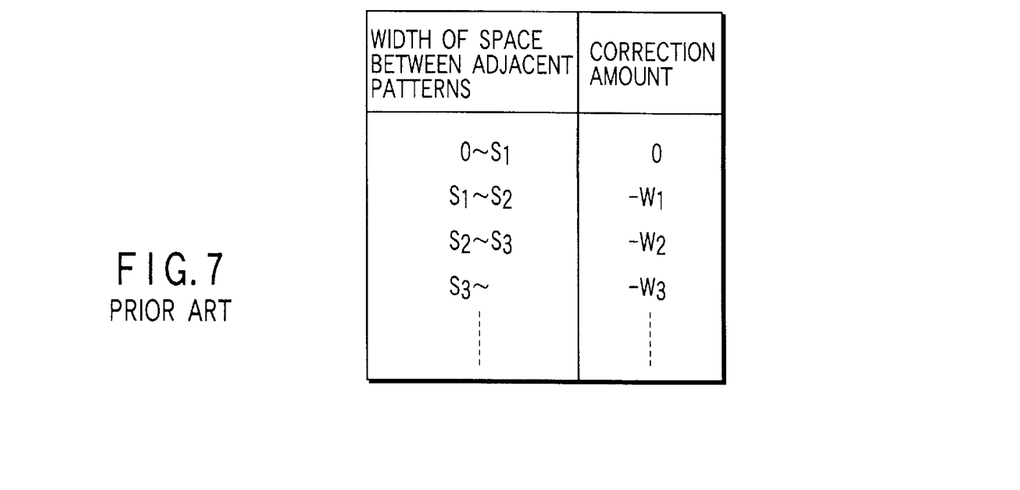
FIG. 7 is a correction table employed in the conventional correction method.

Concerning the adjacent space widths a–e, a correction table shown in FIG. 7 is referred to. It is determined which space width on the correction table corresponds to each of the adjacent space widths a–e, and then a corresponding pattern is corrected using a correction amount based on the determined width.

However, since in the conventional OPC techniques, a correction amount is determined only for the distance to the adjacent pattern, they cannot realize highly accurate OPC for different gate materials where a single device includes transistors which contain the different gate materials (the above-described conventional case uses a $p^+$-type polysilicon gate and an $n^+$-type polysilicon gate).

Moreover, to realize, from now on, accurate correction in a device with a single gate pattern formed of a plurality of gate materials, a mask pattern correction method is necessary for individually correcting those portions of the mask pattern which are formed of different gate materials.

BRIEF SUMMARY OF THE INVENTION

It is the object of the invention to provide a mask pattern correction method and system for a semiconductor device which incorporates transistors of different gate materials, which method and system can realize accurate correction for each gate material without correcting gate mask patterns of different gate materials.

According to a first aspect of the invention, there is provided a mask pattern correction method for a semiconductor device which uses patterns formed of a first to-be-processed material and patterns formed of a second to-be-processed material having post-processing properties different from those of the first to-be-processed material, comprising the steps of:

extracting each of the patterns formed of the first to-be-processed material;

calculating the distance between the each pattern formed of the first to-be-processed material and a pattern adjacent to the pattern formed of the first to-be-processed material, the pattern adjacent to the pattern formed of the first to-be-processed material being one of the patterns formed of the first and second to-be-processed materials;

referring to a first correction table for the pattern adjacent to the each pattern formed of the first to-be-processed material;

correcting the each pattern formed of the first to-be-processed material on the basis of the first correction table;

extracting each of the patterns formed of the second to-be-processed material;

calculating the distance between the each pattern formed of the second to-be-processed material and a pattern adjacent to the each pattern formed of the second to-be-processed material, the pattern adjacent to the each pattern formed of the second to-be-processed material being one of the patterns formed of the first and second to-be-processed materials;

referring to a second correction table for the pattern adjacent to the each pattern formed of the second to-be-processed material; and correcting the each pattern formed of the second to-be-processed material on the basis of the second correction table.

According to a second aspect of the invention, there is provided a mask pattern correction method for a semiconductor device which uses patterns formed of a first to-be-processed material and patterns formed of a second to-be-processed material having post-processing properties different from those of the first to-be-processed material, comprising the steps of:

extracting each of the patterns formed of the first to-be-processed material;

calculating the distance between the each pattern formed of the first to-be-processed material and a pattern adjacent to the pattern formed of the first to-be-processed material, the pattern adjacent to the pattern formed of the first to-be-processed material being formed of the first to-be-processed material;

referring to a first correction table for the pattern adjacent to the each pattern formed of the first to-be-processed material;

correcting the each pattern formed of the first to-be-processed material on the basis of the first correction table;

extracting each of the patterns formed of the second to-be-processed material;

calculating the distance between the each pattern formed of the second to-be-processed material and a pattern adjacent to the each pattern formed of the second to-be-processed material, the pattern adjacent to the each pattern formed of the second to-be-processed material being formed of the second to-be-processed material;

referring to a second correction table for the pattern adjacent to the each pattern formed of the second to-be-processed material; and correcting the each pattern formed of the second to-be-processed material on the basis of the second correction table.

According to a third aspect of the invention, there is provided a mask pattern correction system for semiconductor devices, comprising:

pattern data storage means which stores mask pattern data;

a plurality of region extraction means for each extracting a region for a corresponding material or process, from the mask pattern data output from the pattern data storage means;

correction value storage means which stores mask pattern correction values corresponding to the mask pattern data stored in the pattern data storage means;

a plurality of correction value reference means for selecting the regions extracted by the plurality of region extraction means, with reference to the mask pattern correction values stored in the correction value storage means; and a corrected-pattern synthesizing section for correcting each mask pattern data item corresponding to the material or the process on the basis of the regions selected by the plurality of correction value reference means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The embodiment of the invention will be described with reference to the accompanying drawings.

Figure 8:
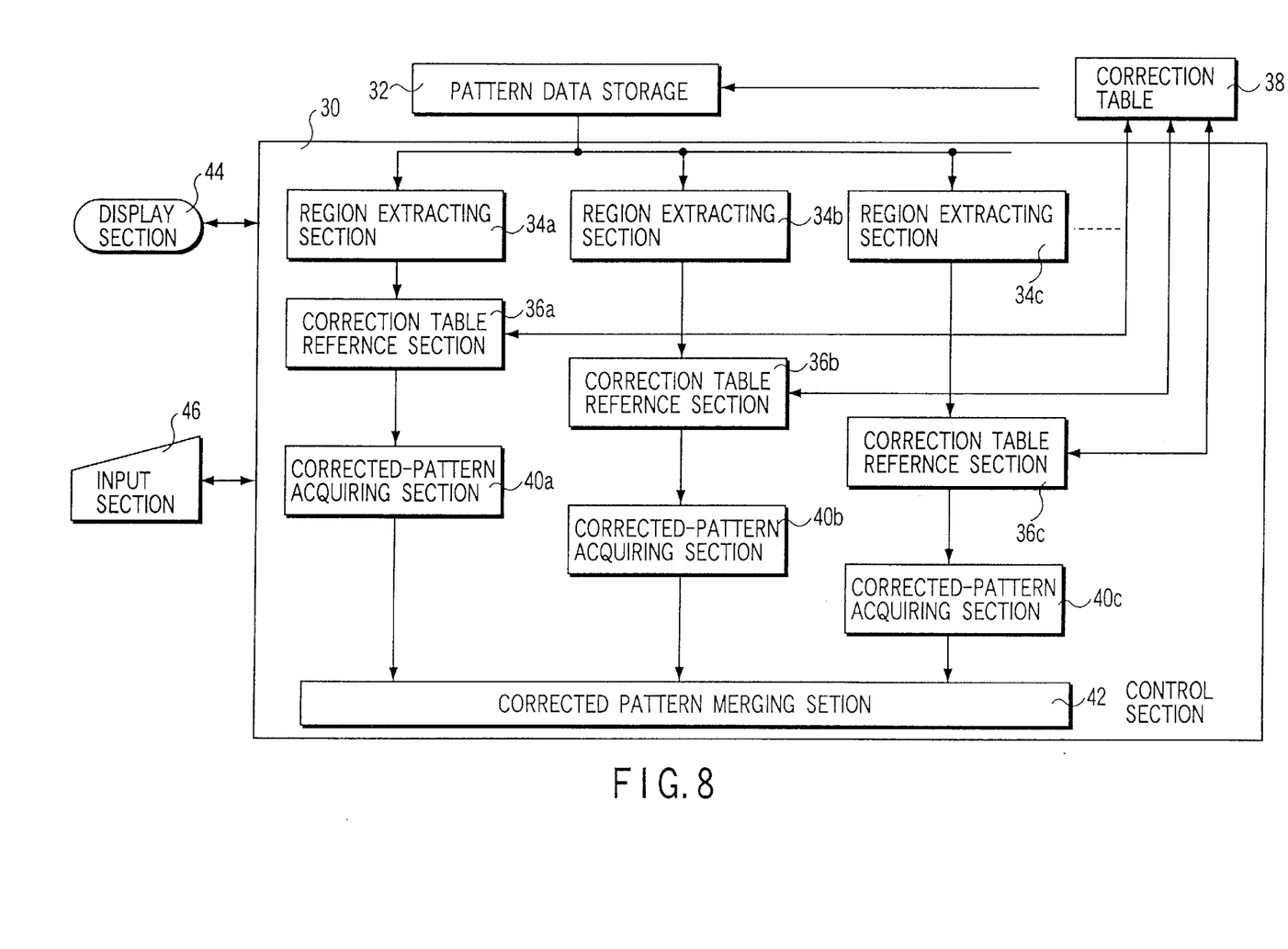
FIG. 8 is a schematic block diagram, showing a mask pattern correction system for executing a mask pattern correction method, according to the embodiment of the invention.

FIG. 8 is a schematic block diagram, showing a mask pattern correction system for executing a mask pattern correction method, according to the embodiment of the invention.

In FIG. 8, a control section 30 incorporated in the mask pattern correction system is connected to a pattern data storage 32 which stores pattern data input by the designer of the semiconductor device. The pattern data storage 32 is connected to region extracting sections 34a, 34b, 34c, . . . for each extracting a region in which, for example, a corresponding gate material or process is used. More specifically, each extracting section 34a, 34b, 34c, . . . extracts regions at intervals of, for example, 0.25 μm, 0.3 μm, etc.

Extraction data items output from the region extracting sections 34a, 34b, 34c, . . . are supplied to correction table reference sections 36a, 36b, 36c, respectively. These sections 36a, 36b, 36c, . . . refer to a correction table 38 which stores correction values and is provided outside the control section 30, in order to obtain correction values corresponding to the extraction data items, and output the correction values to corrected-pattern acquiring sections 40a, 40b 40c, . . . , respectively.

Correction values output from the corrected-pattern acquiring sections 40a, 40b, 40c, . . . are supplied to a corrected-pattern merging section 42, where each designed pattern formed of a corresponding gate material is corrected on the basis of a corresponding one of the correction values.

The control section 30 is further connected to a display section 44 such as a CRT display, and to an input section 46 such as a keyboard.

The aforementioned Bucket method is well known as a one-directional correction method for gate patterns. This embodiment is directed to a mask pattern correction method of the Bucket method type, which is applied to a semiconductor device with transistors formed using a plurality of gate materials. More specifically, the embodiment employs buried channel CMOS transistors as transistors using a plurality of gate materials, in which a $p^+$-type polysilicon gate electrode is provided for an n-channel element, and an $n^+$-type polysilicon gate electrode for a p-channel element.

Figure 9:
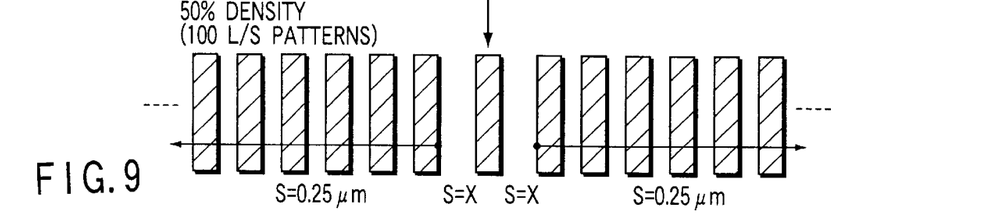
FIG. 9 is a view, showing a pattern dimension measurement TEG for quantifying an optical proximity effect due to a process.

FIG. 9 is a view, showing a pattern dimension measurement TEG called an "ACLV".

In the TEG shown in FIG. 9, the density of patterns adjacent to a pattern whose electrical characteristics are to be measured is 50%. However, the TEG may have another pattern density. It suffices if the relationship between the pattern density and the finished dimension bias can be grasped. For example, the adjacent pattern density may be 100%.

Figure 10:
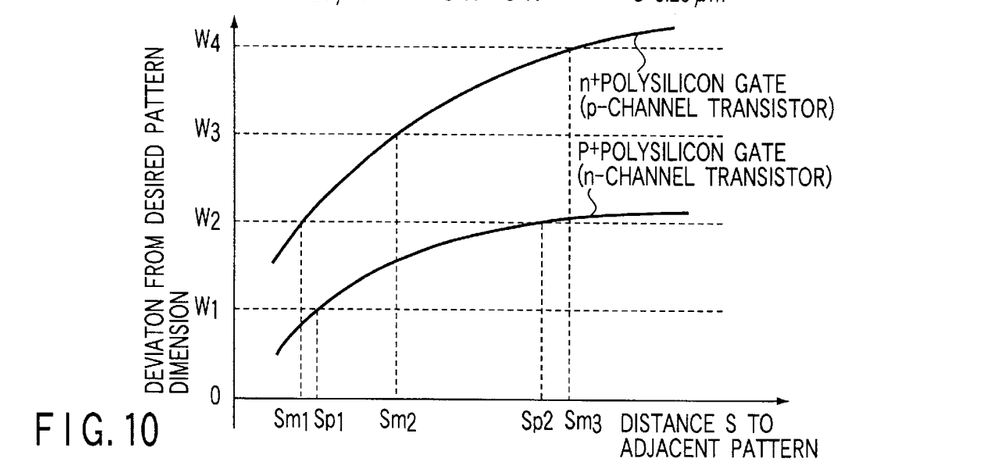
FIG. 10 is a graph, showing the relationship of the distance between adjacent patterns, to the difference between the actual pattern dimension and a desired pattern dimension.

The relationship between the pattern density and the finished dimension bias shown in FIG. 10 can be obtained by designing the TEG shown in FIG. 9 such that it is formed of a plurality of gate materials (a $p^+$-type polysilicon gate electrode is provided for an n-channel element, and an $n^+$-type polysilicon gate electrode for a p-channel element), and then estimating the electrical characteristics of the TEG.

As is evident from FIG. 10, the $p^+$-type polysilicon gate electrode and the $n^+$-type polysilicon gate electrode have different impurities and different impurity densities in their polysilion substrates, and hence different post-etching properties (different post-etching shapes or different rates of dimensional change between before and after etching). Accordingly, the relationship of the pattern density to the finished dimension bias differs between the different gate materials.

Figure 11:
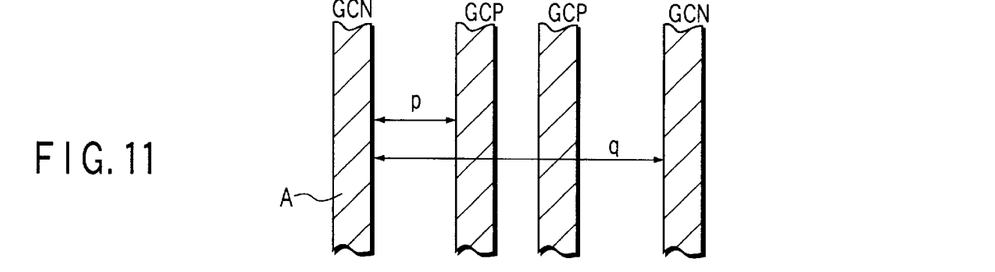
FIG. 11 is a view, showing an example of a correction region.
Figure 12:
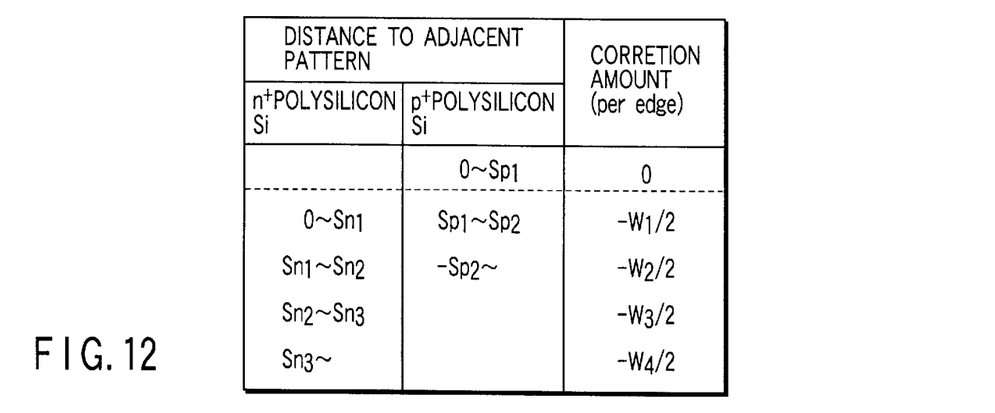
FIG. 12 is a view, showing an example of a table.

A correction table as shown in FIG. 12 is prepared from the characteristics shown in FIG. 10. The correction table shows the relationship between each pattern density (the distance between each pair of adjacent patterns in FIG. 12) and a corresponding correction amount for correcting designed data. The correction amount is added to a designed pattern edge, and set at a value obtained by multiplying a mask drawing minimum grid by an integer. An actual circuit pattern is corrected on the basis of the correction table. A method for extracting the distance between adjacent patterns slightly differs between different wafer treating processes which can be employed in an actual circuit. FIG. 11 shows an example of a correction region.

Where wafer treating steps as shown in FIGS. 3A–3C are employed, calculation is performed including a case where the adjacent pattern is a p-type to-be-measured pattern GCP, to obtain the distance from an n-type to-be-measured pattern GCN to a pattern adjacent thereto as shown in FIG. 11. This is because the distance between a pattern A and a pattern adjacent to the right edge of the pattern A may be erroneously calculated as q (should be p, actually) unless the patterns GCP are included. Further, where wafer treating steps as shown in FIGS. 4A–4E are employed, the distance from the pattern A to a pattern adjacent thereto is q.

Thus, an appropriate correction value is selected from the correction table of FIG. 12 on the basis of the calculated distance.

As is evident from the characteristics shown in FIG. 10, the distance from a target pattern to an adjacent pattern differs between the cases of the $p^+$-type polysilicon gate electrode and the $n^+$-type polysilicon gate electrode. In light of this, the system is set so that an appropriate correction amount can be selected in accordance with the type (p or n) of gate.

Figure 13:
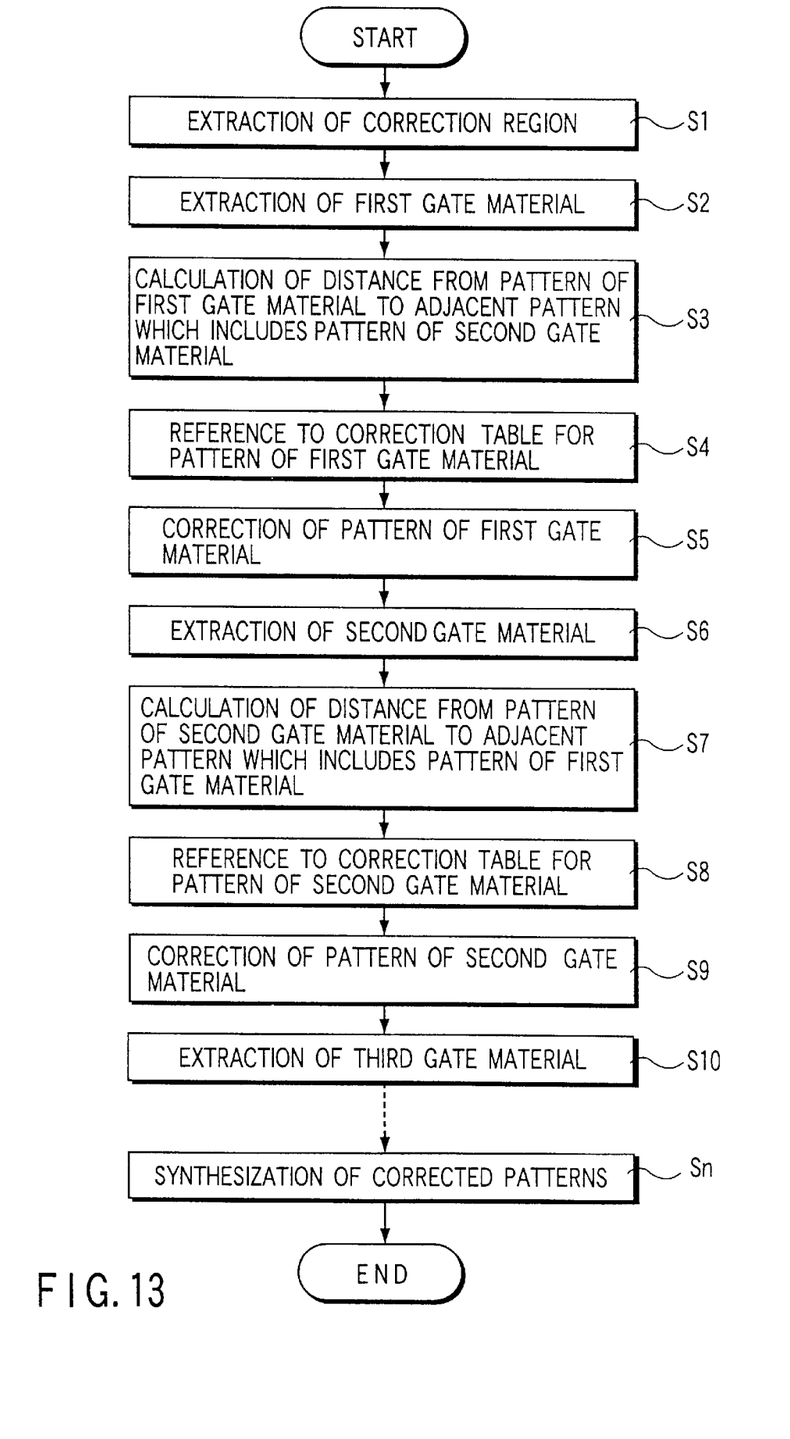
FIG. 13 is a flowchart, useful in explaining the operation of a mask pattern correction system.

Referring then to the flowchart of FIG. 13, the operation of the mask pattern correction system of the invention will be described.

First, at a step S1, a correction region as shown in FIG. 11 is extracted. At the next step S2, an $n^+$-type polysilicon gate layer formed of a first gate material and indicated as a to-be-measured pattern GCN in FIG. 11, is extracted by the region extracting section 34a.

At a step S3, where wafer treating steps as shown in FIGS. 3A–3C are employed, the distance is calculated from the $n^+$-type polysilicon gate layer formed of the first gate material to a pattern which is adjacent thereto and can be a $p^+$-type polysilicon gate layer formed of a second gate material and indicated as a to-be-measured pattern GCP. Similarly, where wafer treating steps as shown in FIGS. 4A–4E are employed, calculation is performed including no GCPs. The reason why the $p^+$-type polysilicon gate layer is included or not is as mentioned above.

At a step S4, a correction table for the pattern adjacent to the $n^+$-type polysilicon gate layer formed of the first gate material is referred to by the correction table reference section 36a. An appropriate correction amount is selected from a correction table as shown in FIG. 12, and the pattern of the $n^+$-type polysilicon gate layer (the first gate material) is corrected at a step S5. The corrected value is output to the corrected-pattern acquiring section 40a.

At the next step S6, where wafer treating steps as shown in FIGS. 3A–3C are employed, a $p^+$-type polysilicon gate layer formed of the second gate material and indicated as a to-be-measured pattern GCP in FIG. 11, is extracted by the region extracting section 34b. At a step S7, the distance is calculated from the $p^+$-type polysilicon gate layer formed of the second gate material to a pattern which is adjacent thereto and can be an $n^+$-type polysilicon gate layer formed of the first gate material and indicated as a to-be-measured pattern GCN. Similarly, where wafer treating steps as shown in FIGS. 4A–4E are employed, calculation is performed including no GCNs.

At a step S8, a correction table for the pattern adjacent to the $p^+$-type polysilicon gate layer of the second gate material is referred to by the correction table reference section 36b. An appropriate correction amount is selected from a correction table as shown in FIG. 12, and the pattern of the $p^+$-type polysilicon gate layer (the second gate material) is corrected at a step S9. The corrected value is output to the corrected-pattern acquiring section 40b.

At a step S10, a third gate material is extracted by the region extracting section 34c. At the steps after the step S10, same processing is performed for each extracted region as performed at the steps S2–S5 or S6–S9.

After that, at a step Sn, corrected patterns formed of different gate materials are synthesized. This pattern synthesization is done by acquiring all the corrected gate patterns using the corrected-pattern merging section 42.

As described above, design data is corrected (a correction amount is added to an edge portion of each pattern) for each of the $p^+$-type polysilicon gate electrode and the $n^+$-type polysilicon gate electrode using correction tables as shown in FIG. 12, thereby realizing accurate correction.

Although the above-described embodiment employs buried channel CMOS transistors in which a $p^+$-type polysilicon gate electrode is provided for an n-channel element, and an $n^+$-type polysilicon gate electrode for a p-channel element, it is a matter of course that the invention is also applicable to other gate materials such as silicide materials (WSi, TiSi, MoSi) of a high fusion point, or a lamination structure of an insulating film (a cap material of silicon nitride, silicon oxide, etc.) and a gate conductive material.

As described above, the invention provides a mask pattern correction method and system for a semiconductor device which employs transistors formed using a plurality of gate materials, capable of realizing accurate OPC of each gate material without mask pattern correction for each gate material. As a result, transistor characteristics close to designed ones can be achieved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask pattern correction method for a semiconductor device which uses patterns formed of a first to-be-processed material and patterns formed of a second to-be-processed material having post-processing properties different from those of the first to-be-processed material, comprising the steps of:

extracting each of the patterns formed of the first to-be-processed material;

calculating the distance between said each pattern formed of the first to-be-processed material and a pattern adjacent to the pattern formed of the first to-be-processed material, the pattern adjacent to the pattern formed of the first to-be-processed material being formed of one of the first and second to-be-processed materials;

referring to a first correction table for the pattern adjacent to said each pattern formed of the first to-be-processed material;

correcting said each pattern formed of the first to-be-processed material on the basis of the first correction table;

extracting each of the patterns formed of the second to-be-processed material;

calculating the distance between said each pattern formed of the second to-be-processed material and a pattern adjacent to said each pattern formed of the second to-be-processed material, the pattern adjacent to said each pattern formed of the second to-be-processed material being formed of one of the first and second to-be-processed materials;

referring to a second correction table for the pattern adjacent to said each pattern formed of the second to-be-processed material; and correcting said each pattern formed of the second to-be-processed material on the basis of the second correction table.

2. A mask pattern correction method for a semiconductor device which uses patterns formed of a first to-be-processed material and patterns formed of a second to-be-processed material having post-processing properties different from those of the first to-be-processed material, comprising the steps of:

extracting each of the patterns formed of the first to-be-processed material;

calculating the distance between said each pattern formed of the first to-be-processed material and a pattern adjacent to the pattern formed of the first to-be-processed material, the pattern adjacent to the pattern formed of the first to-be-processed material being formed of the first to-be-processed material;

referring to a first correction table for the pattern adjacent to said each pattern formed of the first to-be-processed material;

correcting said each pattern formed of the first to-be-processed material on the basis of the first correction table;

extracting each of the patterns formed of the second to-be-processed material;

calculating the distance between said each pattern formed of the second to-be-processed material and a pattern adjacent to said each pattern formed of the second to-be-processed material, the pattern adjacent to said each pattern formed of the second to-be-processed material being formed of the second to-be-processed material;

referring to a second correction table for the pattern adjacent to said each pattern formed of the second to-be-processed material; and correcting said each pattern formed of the second to-be-processed material on the basis of the second correction table.

3. A mask pattern correction method according to claim 1, wherein the first and second to-be-processed materials are conductive materials which have conductivity types opposite to each other.

4. A mask pattern correction method according to claim 1, wherein the post-processing properties include post-etching properties.

5. A mask pattern correction method according to claim 3, wherein the conductive materials are used as the materials of control electrodes.

6. A mask pattern correction method according to claim 3, wherein the conductive materials are gate electrode materials which contain polysilicon.

7. A mask pattern correction method according to claim 4, wherein the conductive materials are gate electrode materials which contain polysilicon.

8. A mask pattern correction method according to claim 5, wherein the conductive materials are gate electrode materials which contain polysilicon.

9. A mask pattern correction method according to claim 2, wherein the first and second to-be-processed materials are conductive materials which have conductivity types opposite to each other.

10. A mask pattern correction method according to claim 2, wherein the post-processing properties include post-etching properties.

11. A mask pattern correction method according to claim 9, wherein the conductive materials are used as the materials of control electrodes.

12. A mask pattern correction method according to claim 9, wherein the conductive materials are gate electrode materials which contain polysilicon.

13. A mask pattern correction method according to claim 10, wherein the conductive materials are gate electrode materials which contain polysilicon.

14. A mask pattern correction method according to claim 11, wherein the conductive materials are gate electrode materials which contain polysilicon.

15. A mask pattern correction system for semiconductor devices, comprising:

pattern data storage means which stores mask pattern data;

a plurality of region extraction means for each extracting a region for a corresponding material or process, from the mask pattern data output from the pattern data storage means;

correction value storage means which stores mask pattern correction values corresponding to the mask pattern data stored in the pattern data storage means;

a plurality of correction value reference means for selecting the regions extracted by the plurality of region extraction means, with reference to the mask pattern correction values stored in the correction value storage means; and a corrected-pattern synthesizing section for correcting each mask pattern data item corresponding to the material or the process on the basis of the regions selected by the plurality of correction value reference means.

16. A mask pattern correction system according to claim 15, wherein the regions extracted by the plurality of extraction means are formed of different gate electrode materials.

* * * * *

UNITED STATES PATENT AND TRADEMARK OFFICE
CERTIFICATE OF CORRECTION

PATENT NO. : 6,060,368
DATED : May 9, 2000
INVENTORS : Koji HASHIMOTO et al.

It is certified that error appears in the above-identified patent and that said Letters Patent is hereby corrected as shown below:

Title Page, Item [54], in the Title, after "METHOD", insert --AND SYSTEM--.

Signed and Sealed this

Twenty-second Day of May, 2001

*Attest:*

NICHOLAS P. GODICI

*Attesting Officer*     *Acting Director of the United States Patent and Trademark Office*